(12) United States Patent
Zediker et al.

(10) Patent No.: US 6,312,166 B1
(45) Date of Patent: Nov. 6, 2001

(54) LASER DIODE ARRAYS AND SYSTEMS INCLUDING STRUCTURES FOR PERMITTING OPTICAL POWER MEASUREMENT THEREFROM

(75) Inventors: Mark S. Zediker; Thomas M. Pallett, both of Florissant; John M. Haake, St. Charles; James A. Priest, St. Louis, all of MO (US)

(73) Assignee: Nuvonyx, Inc., Bridgestone, MO (US)

( * ) Notice: Subject to any disclaimer, the term of this patent is extended or adjusted under 35 U.S.C. 154(b) by 0 days.

(21) Appl. No.: 09/376,491

(22) Filed: Aug. 18, 1999

Related U.S. Application Data

(60) Provisional application No. 60/110,052, filed on Nov. 25, 1998.

(51) Int. Cl.[7] .................................................. G02B 6/36
(52) U.S. Cl. ............................................................ 385/88
(58) Field of Search .................................. 385/88, 92, 57; 372/29.02, 36

(56) References Cited

U.S. PATENT DOCUMENTS

| | | | |
|---|---|---|---|
| 5,017,010 | 5/1991 | Mamin et al. | 356/349 |
| 5,029,335 * | 7/1991 | Fisher et al. | 372/36 |
| 5,081,639 | 1/1992 | Snyder et al. | 372/101 |
| 5,265,113 * | 11/1993 | Halldorsson et al. | 372/36 |
| 5,301,014 | 4/1994 | Koch | 356/437 |
| 5,394,488 | 2/1995 | Fernald et al. | 385/13 |
| 5,475,235 | 12/1995 | Phillips et al. | 250/574 |
| 5,490,160 * | 2/1996 | Kovacs et al. | 372/50 |
| 5,504,762 | 4/1996 | Hutchison | 372/29 |
| 5,526,373 | 6/1996 | Karpinski | 372/101 |
| 5,561,547 | 10/1996 | Keirstead et al. | 359/288 |
| 5,579,422 | 11/1996 | Head et al. | 372/101 |
| 5,640,188 * | 6/1997 | Andrews | 347/130 |
| 5,652,763 | 7/1997 | Delfyett, Jr. | 372/107 |
| 5,668,825 | 9/1997 | Karpinski | 372/101 |
| 5,668,826 | 9/1997 | Bezinge et al. | 372/32 |
| 5,715,264 | 2/1998 | Patel et al. | 372/36 |
| 5,734,766 | 3/1998 | Flint | 385/43 |
| 5,743,901 | 4/1998 | Grove et al. | 606/9 |
| 5,745,514 | 4/1998 | Patel et al. | 372/43 |
| 5,745,519 | 4/1998 | Ruda et al. | 372/101 |
| 5,781,297 | 7/1998 | Castore | 356/349 |
| 5,825,803 | 10/1998 | Labranche et al. | 372/101 |
| 5,828,045 | 10/1998 | Brömse | 235/455 |
| 5,828,683 | 10/1998 | Freitas | 372/36 |
| 5,832,150 | 11/1998 | Flint | 385/31 |
| 5,854,806 | 12/1998 | Sutter | 372/82 |
| 6,061,374 * | 5/2000 | Nightingale et al. | 372/43 |
| 6,144,684 * | 11/2000 | McMinn et al. | 372/50 |

* cited by examiner

*Primary Examiner*—Scott J. Sugarman
*Assistant Examiner*—John J. Magee

(57) ABSTRACT

A laser diode system permitting indirect measurement of optical power includes a laser diode which emits usable light from a front facet and spontaneously emits stray light substantially proportional to the usable light from another facet; and a light pipe disposed proximate to the laser diode which collects and waveguides only the stray light to thereby generate a stray light beam providing an indication of optical power.

20 Claims, 11 Drawing Sheets

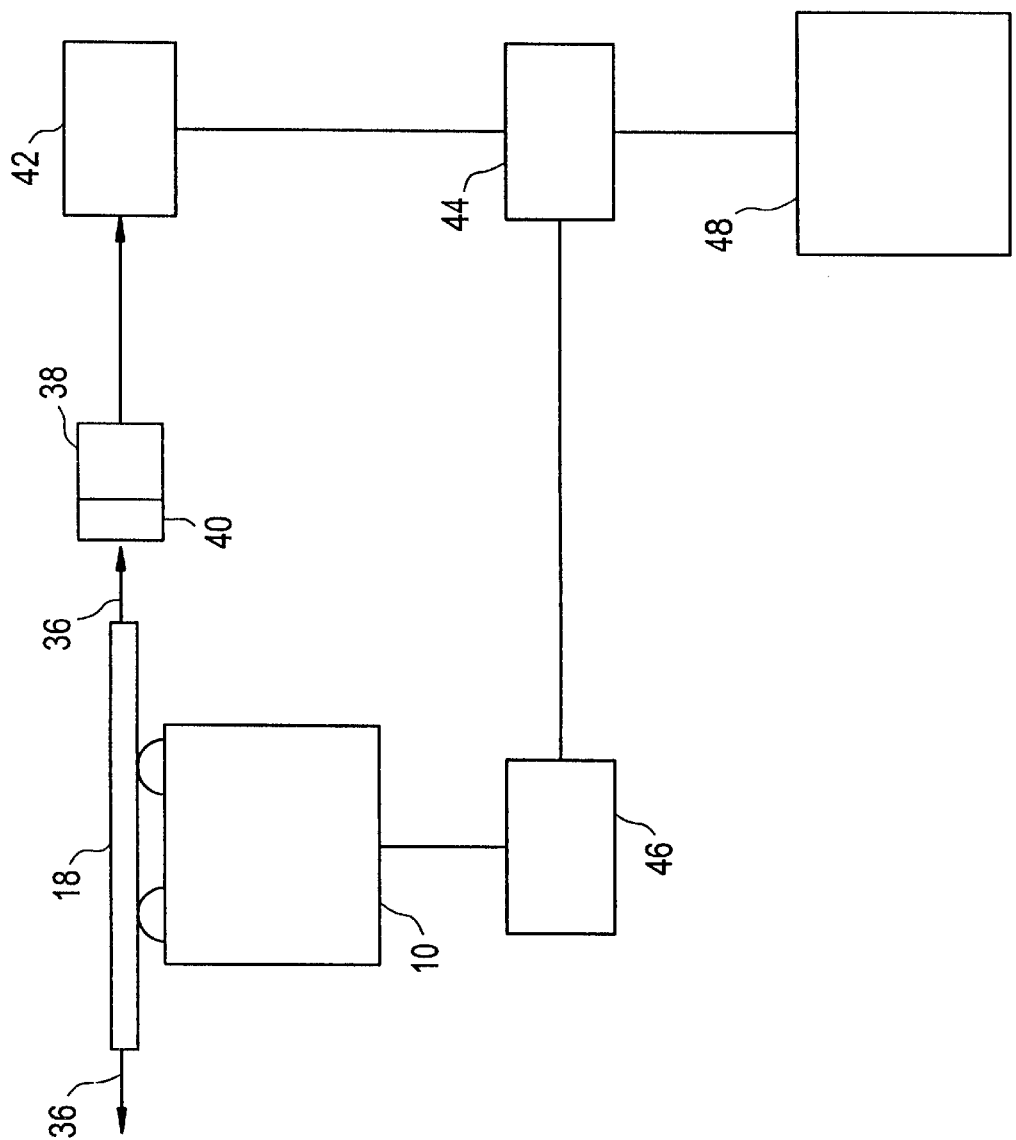

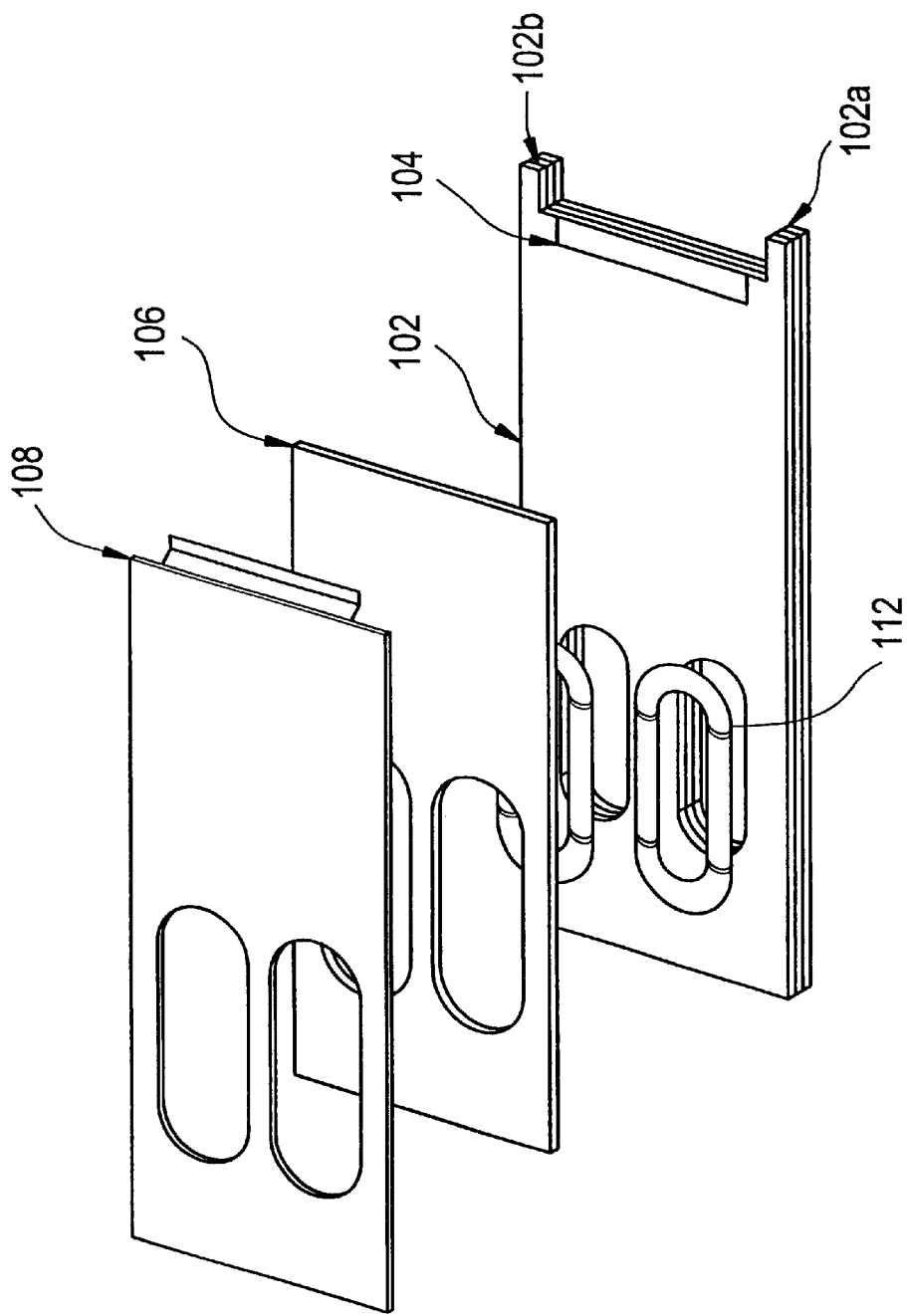

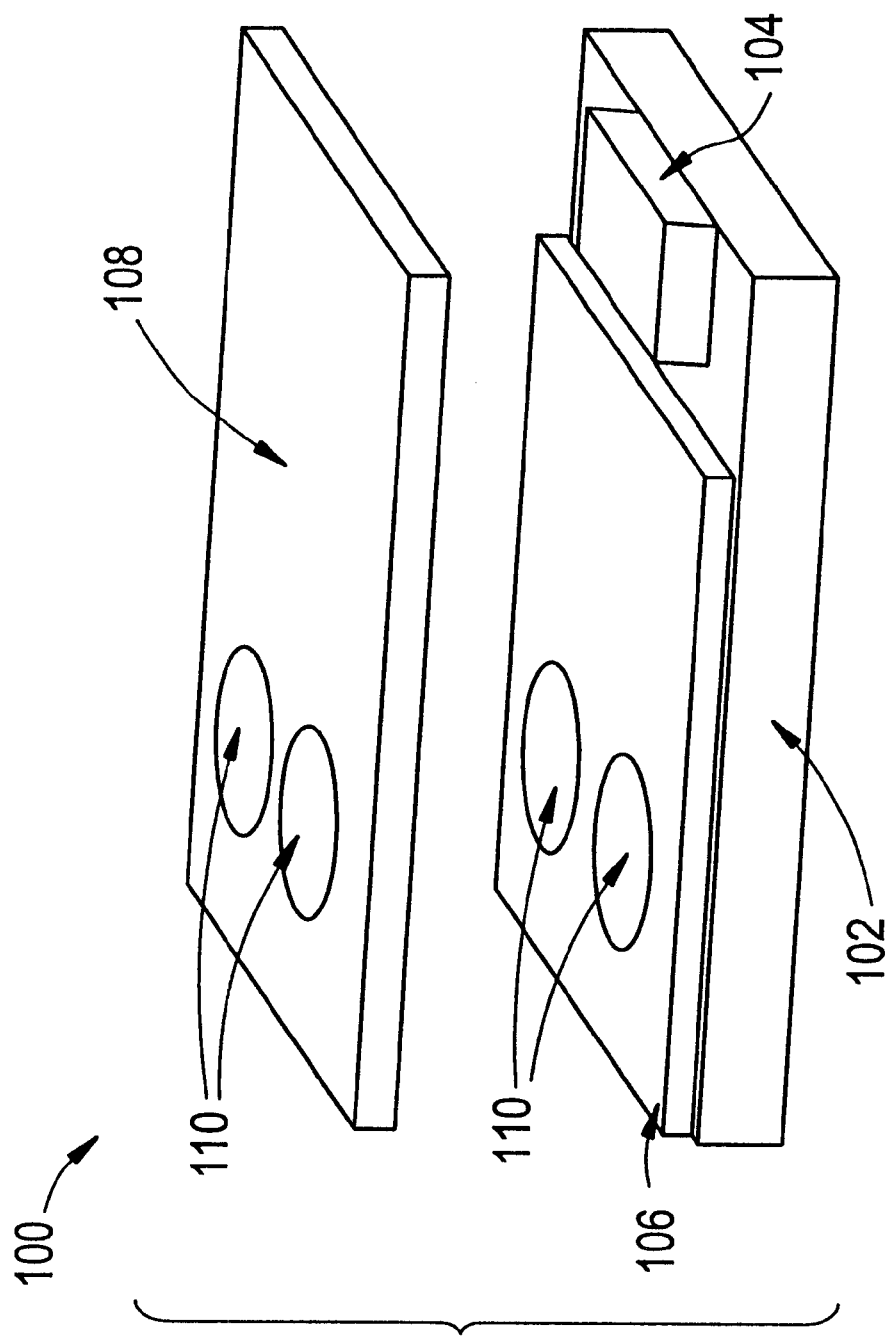

LASER DIODE ARRAYS AND SYSTEMS INCLUDING STRUCTURES FOR PERMITTING OPTICAL POWER MEASUREMENT THEREFROM

This application claim benefit to provisional No. 60/110,052 filed Nov. 25, 1998.

BACKGROUND OF THE INVENTION

The present invention relates generally to a laser diode array. More specifically, the present invention relates to a laser diode array having integral structures that facilitate the measurement of optical power generated by the laser diode array.

Laser diodes degrade with time and use. Therefore, the current supplied to the laser diode to produce a predetermined optical power at the beginning of life of the laser diode will be different from the current needed to produce the same predetermined optical power at the end of the effective life, i.e., just prior to failure, of that laser diode. It will be appreciated that this fact gives rise to the need to recalibrate the Power vs. Current curve and subsequently control these parameters over the operating life of the laser diode array. This laser diode aging problem is exacerbated when the device being controlled is not a single laser diode but a laser diode array constructed from many laser diode bars, each laser diode bar including a plurality of distinct laser diodes. If one bar fails, then the array continues to operate but at a reduced output level, which could adversely affect the quality of the product being manufactured with the laser.

Moreover, it is often desirable to be able to directly monitor various performance parameters of a laser diode array or system. These performance parameters can include, but are not limited to:

(i) power output;
(ii) optical activity or output;
(iii) wavelength detection and tuning indications;
(iv) laser operation data of the pumped laser using light traveling back from the laser medium in the cavity to the diode pump source;
(v) pulse output characteristics of pulse-driven diode pump sources; and
(vi) feedback from damaged optical fiber links for detection and diagnostic purposes.

Coupling optics have been used for coupling output emissions of a laser diode pump source to an optical fiber. An example of such coupling optics is disclosed in U.S. Pat. No. 5,127,068 (hereinafter the '068 patent), which is incorporated herein by reference. In the '068 patent, radiation emitted from a laser diode bar, constructed from a plurality of emitters, is focused into a corresponding number of multi-mode optical fibers by means of coupling optics placed between the emitting facets of respective emitters and the ends of the multi-mode optical fibers. The coupling optics disclosed in the '068 patent is simply a piece of the same multi-mode optical fiber, a strand of which extends along the length of a diode bar pump source. It will be appreciated that the coupling optics must be carefully positioned with respect to the emitter facets of the laser diode bar in order to properly collimate the emitter outputs. This is accomplished by aligning and securing the coupling optics in place with a suitable epoxy material.

Diagnosis of the performance characteristics for the system discussed immediately above are generally achieved by placing a beam sampling device, e.g., a beam splitter, in the path of the emitted light between any two of the diode pump source, the coupling optics, and the optical fiber. This diagnostic technique presents at least three problems:

(i) a beam sampler significantly increases the size of the package;
(ii) a beam sampler placed in the path of the emitted light attenuates a portion of the available light, which might otherwise be delivered; and
(iii) a beam sampler increases the cost of the system.

Moreover, even if the problem of limited space in the laser diode system were ignored, building a feedback subsystem for such a system would require extra mechanical components for stability. Such stabilizing elements add complexity to the feedback system as well as increase the weight and cost of the overall system.

In an attempt to overcome the problems mentioned above, U.S. Pat. No. 5,504,762 (hereinafter the '762 patent), which is also incorporated herein by reference, proposed employing the optical fiber constituting the coupling optics to conduct stray radiation, which is not included in the beam that is generated in the emission path by small imperfections in the surface of the lens, to an alternate location. The optical fiber, having a first end and a second end, is oriented with respect to the coupling optics such that radiation from the emitter region is optically coupled into the optical fiber. The second end of the optical fiber is coupled to the laser cavity. A detector is positioned in a spaced, adjacent relationship to the coupling optics, i.e., in an emission path of the stray radiation. The detector detects at least a portion of the stray radiation, and produces a detected output in response to the stray radiation.

More specifically, FIG. 1 discloses an arrangement for coupling the radiation emitted from laser diode source 10, which has a single emitter region, or a bar, having a plurality of emitters 20, 22 and 24, into multi-mode optical fibers 26, 28 and 30, which fibers are part of an optical fiber bundle 32. The arrangement includes a coupling optics 18 disposed between the emitter facets of emitters 20, 22 and 24, and the ends of multi-mode optical fibers 26, 28 and 30. It will be noted that it is not necessary to couple a certain number of laser diode emitters to an equal number of fibers, fiber bundles, or other optical transfer elements. It is possible to overlay power from more than one emitter to a smaller number of fibers, fiber bundles, or optical transfer elements. It will also be noted that optical transfer devices can extend beyond fibers and can be substantially any optical device or media, either reflective, refractive or open media which is placed at the output of laser diode source 10 to allow the output to be effectively coupled to a desired application. Air is only one of many transfer elements. Other suitable transfer elements include fluids, liquids, and solids.

It should be mentioned that a spacing of approximately 60 microns from the near edge of coupling optics 18 to the diode facet is satisfactory for a 250-micron diameter fiber that has an index of refraction of 1.5. The optical spacing of the optical fiber end from coupling optics 18 should be as small as possible; a spacing of about 20 microns is acceptable.

It will be noted that the diameter of coupling optics 18 is chosen to be roughly equal to the diameter of the optical fiber to be coupled. The diameter of coupling optics 18 may be less than the diameter of the optical fiber to be coupled without loss in coupling efficiency. However, if such small coupling optics 18 diameters are used, the alignment of coupling optics 18 is more difficult. Coupling optics 18 is placed with respect to the output facets of laser diode source 10 in order to properly collimate them. This may be accomplished by carefully aligning coupling optics 18 and securing it in place with a suitable epoxy.

The NA of the optical fiber to be coupled is roughly equal to the low NA direction of diode source 10, typically 0.1 to 0.15. This combination of coupling optics 18 and optical fiber results in a percentage greater than 80% coupling of the laser diode emitted energy into the multi-mode optical fiber. Coupling optics 18 and the butt-coupled end of the fiber have an anti-reflection coating to reduce reflections from these surfaces.

It will be noted that coupling optics 18 is cylindrical in cross-section. Those of ordinary skill in the art will recognize, however, that other cross-sectional shapes, including but not limited to, elliptical and hyperbolic, which can be useful for correction of particular spherical aberrations as known in the art, i.e., Kingslake, *Lens Design Fundamentals,* Academic Press, 1978.

As illustrated in FIG. 1, the optical fibers 26, 28 and 30 are rectangular in cross-section in order to reduce the total amount of glass in the fiber. The width of the rectangular fiber is chosen to be slightly larger than the diode emitting area The height is as small as possible, typically around 30 to 50 microns. It should be noted that although heights smaller than 30 to 50 microns may be used, such heights make alignment of the system more difficult. The diameter of coupling optics 18 is equal to the height of the rectangular fiber, e.g., 30 to 50 microns in the example given. The resulting fiber output is brighter since the total emission area is smaller.

Each emitter region 20, 22, and 24 collectively produces an emitter region emission path of radiation 34 that is optically coupled to optical fibers 26, 28, and 30. Stray radiation is emitted from coupling optics along a stray radiation emission path 36. In FIG. 1, stray radiation emission path 36 is generally perpendicular to emitter region emission path 34. The light that is transmitted along stray radiation emission path 36 is not used to pump the laser medium.

Referring now to FIG. 2, a detector 38 is positioned in a spaced, adjacent relationship to the coupling optics 18, along stray radiation emission path 36. When coupling optics 18 is a fiber, detector 38 is positioned at one end, or both ends, of the fiber in an emission path of stray radiation, which is generated by coupling optics 18. Detector 38 is a semiconductor photodiode, such as a semiconductor photodiode manufactured of materials including but not limited to silicon, germanium, alloys of gallium arsenide, and the like. Positioned between detector 38 and coupling optics 18 is an optical filter 40, which filter eliminates visible light but passes infrared light. Detector 38 is attached to filter 40 to prevent variations due to alignment. Detector 38 detects at least a portion of the stray radiation from coupling optics 18, and produces a detected output in response to the stray radiation.

Coupled to detector 38 is a signal processor 42, e.g., a digital voltmeter, a sensitive amplifier with fixed or adjustable gain which can be constructed from inverting, noninverting amplifiers, comparators or difference amplifier components. Signal processor 42 receives the detected output from detector 38 and generates a processed output that is representative of a detected characteristic of the laser system associated with diode pump source 10. A controller 44 couples the processed output from signal processor 42 to a diode power supply 46. A computer 48 can be included and associated with controller 44. Computer 48 includes a CPU coupled through a system bus. This system bus can include a keyboard, disk drive, or other non-volatile memory systems, display, and other peripherals, as known in the art. Also coupled to the bus are a program memory and a data memory.

From the discussion above, it will be appreciated that the feedback system for a laser diode bar cannot be readily adapted to a laser diode array constructed from a plurality of laser diode bars. For example, in order to sample the output of several laser diode bars 10, each of the laser diode bars 10 would have associated therewith a separate coupling optics 18. In addition, it will be noted that the each filament of the coupling optics 18 has an associated mechanical coupling device (not shown) to connect to the detector 38 and that additional structural elements must be included in the overall system to provide additional rigidity to the ends of the coupling optics 18 proximate to the detector 38 in the laser diode system depicted in FIG. 2.

It would be highly desirable to provide a feedback system that is much simpler than those currently proposed. It would also be highly desirable to provide a sampling mechanism that is more robust than those currently proposed. There is a need for a feedback system that would not occupy the limited space between any two of the diode laser source, the coupling optics, a fiber bundle, a laser gain medium, and the focussing optics. There is also a need for a sampling mechanism which does not use light intended for use in pumping the laser medium as an input. In particular, there is an attendant need for a sampling mechanism which permits sampling of the output of the entire laser diode array without substantially impacting the footprint of the array, which would allow the arrays adjacent to one another in a multiple array system to be mounted with minimal separation. It would also be highly desirable to be able to selectively detect the optical power coming from the whole laser diode array or the optical power generated by any one of the individual laser diode bars in a laser diode array.

SUMMARY OF THE INVENTION

Based on the above and foregoing, it can be appreciated that there presently exists a need in the art for an improved laser diode array which overcomes the above-described deficiencies in the prior art. The present invention was motivated by a desire to overcome the drawbacks and shortcomings of the presently available technology, and thereby fulfill this need in the art.

It is often necessary to control the output power of a laser diode array and to monitor the power degradation over time. Preferably, the sampling mechanism can gauge optical power without resorting to inserting an optical element in front of the laser diode array, which would adversely affect output power. The laser diode array and/or system according to the present invention includes an integral power sampling subsystem, wherein at least one stability enhancing element of the laser diode array is employed as a light pipe to channel stray optical energy to a measurement element. According to one aspect of the present invention, side plates on this laser diode array are provided which simultaneously provide support for the array and a mechanism for collecting a sample of the light produced by the laser diode array. According to another aspect of the present invention, an electrical isolator advantageously maintains the electrode plates associated with one laser diode bar of the laser diode array parallel to one another while providing a mechanism for collecting a sample of the light produced by the laser diode bar.

The objects, features, and advantages according to the present invention are provided by a laser diode system permitting indirect measurement of optical power. Preferably, the laser diode system includes a laser diode which emits usable light from a front facet and spontaneously emits stray light substantially proportional to the usable light from another facet; and a light pipe disposed proximate to the laser diode which collects and waveguides the stray light to thereby generate a stray light beam providing an indication of optical power.

The objects, features and advantages according to the present invention are provided by a laser diode apparatus, which includes a laser diode which emits light in a first direction from a front facet, a heatsink electrode electrically coupled to a bottom facet of the laser diode, an electrode electrically coupled to a top facet of the laser diode, and an isolator disposed between the heatsink electrode and the electrode, the isolator including a light pipe collecting spontaneous emissions from at least one of a rear, a left side, and a right side facet and waveguiding the collected spontaneous emissions in a second direction opposite to the first direction.

The objects, features and advantages according to the present invention are provided by a laser diode system permitting indirect measurement of optical power. Advantageously, the laser diode system includes a laser diode which emits light in first direction from a front facet, a heatsink electrode electrically coupled to a bottom facet of the laser diode, an electrode electrically coupled to a top facet of the laser diode, an isolator disposed between the heatsink electrode and the electrode, and a structural element. Preferably, the structural element includes a light pipe which collects stray light different from but proportional to a usable component of the light and which waveguides the stray light in a second direction opposite to the first direction to thereby generate a stray light beam providing an indication of optical power. In an exemplary case, the structural element comprises a side plate of the laser diode system.

According to one aspect of the present invention, the laser diode system also includes a lens attached near the front facet of the laser diode so that only stray light, which is equal to the difference between the light and the usable component of the light, is optically coupled to the side plate. According to another aspect of the invention, the stray light corresponds to spontaneous emissions from one of a rear, a left side and a right side facet of the laser diode. When the stray light is produced by the rear facet of the laser diode, a secondary light pipe positioned between the laser diode and the isolator can be employed to route the stray light to the side plate.

BRIEF DESCRIPTION OF THE DRAWINGS

These and various other features and aspects of the present invention will be readily understood with reference to the following detailed description taken in conjunction with the accompanying drawings, in which like or similar numbers are used throughout, and in which:

FIG. 2 is a high-level block diagram of a conventional feedback system incorporating the coupling optics illustrated in FIG. 1;

FIG. 3 is an exploded view of a laser diode unit including a laser diode bar employed in the present invention;

FIG. 4 is a three-dimensional exploded view of selected portions of the laser diode unit illustrated in FIG. 3;

DETAILED DESCRIPTION OF THE PREFERRED EMBODIMENTS

Figure 1:
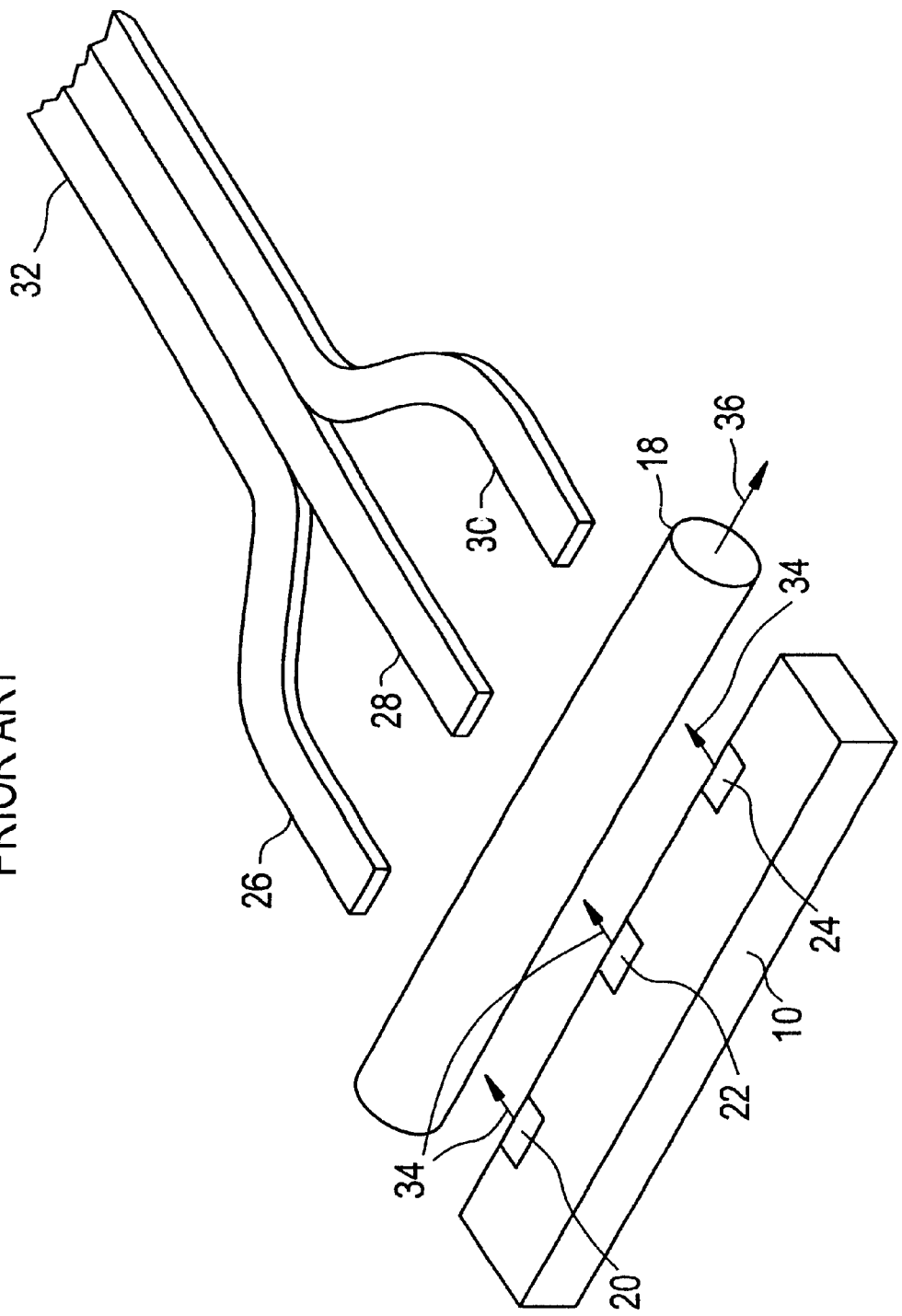
FIG. 1 is a perspective view of a conventional arrangement for coupling the output from a laser diode bar into an optical fiber bundle.

As discussed above, it is desirable to control the output power of a laser diode array and to monitor the power degradation over time, preferably without inserting an optical element in front of the array, which would adversely affect output power. The improved laser diode array according to the present invention satisfies this desire by including an integral power monitor subsystem, wherein at least one stability enhancing element of the laser diode array is employed as a light pipe to channel stray optical energy to a measurement element. In the first through third preferred embodiments according to the present invention, the side plates on a laser diode array simultaneously provide support for the array and a mechanism for collecting a sample of the light produced by the array. According to a fourth preferred embodiment according to the present invention, an electrical isolator advantageously maintains the electrode plates of the laser diode array parallel to one another while providing a mechanism for collecting a sample of the light produced by the laser diode bar. Each of these preferred embodiments will be discussed below in turn.

With respect to the first several preferred embodiments, the improved laser diode array according to the present invention is constructed from an array of laser diode units. Preferably, these laser diode units are constructed from four major elements, as illustrated in FIGS. 3 and 4. In other words, each laser diode unit 100 is constructed from a heatsink electrode 102, a laser diode bar 104, an electrical isolator 106 and an electrode 108. It should be noted that the small tabs 102a, b at the front of the heatsink electrode 102 serve as a place to mount the optics, which are discussed in detail below, for collimating the usable light generated by each laser diode unit 100. It should also be noted from FIG. 4 that the top of the laser diode bar 104 advantageously contacts the underside of electrode 108, i.e., the laser diode bar 104 protrudes above the surface of heatsink electrode 102 contacted by the electrode 108, a portion of which advantageously is shaped to compensate for the thickness of the isolator 106.

It will be appreciated that heat generated by the laser diode bar 104 is transferred to the heatsink electrode 102 for ultimate removal by coolant circulating in coolant channels 110 formed in the heatsink electrode 102, the electrical isolator 106 and the electrode 108. It will also be appreciated that the coolant is maintained in the coolant channels by a plurality of O-ring seals, which are generally denoted 112. The coolant interconnections to the laser diode unit 100 are provided by a pair of O-ring seals 112 on the top and bottom of the laser diode unit. The O-rings on the top of the laser diode unit 100 advantageously can be retained by the combination of the electrical isolator 106 and the electrode 108.

Figure 5A:
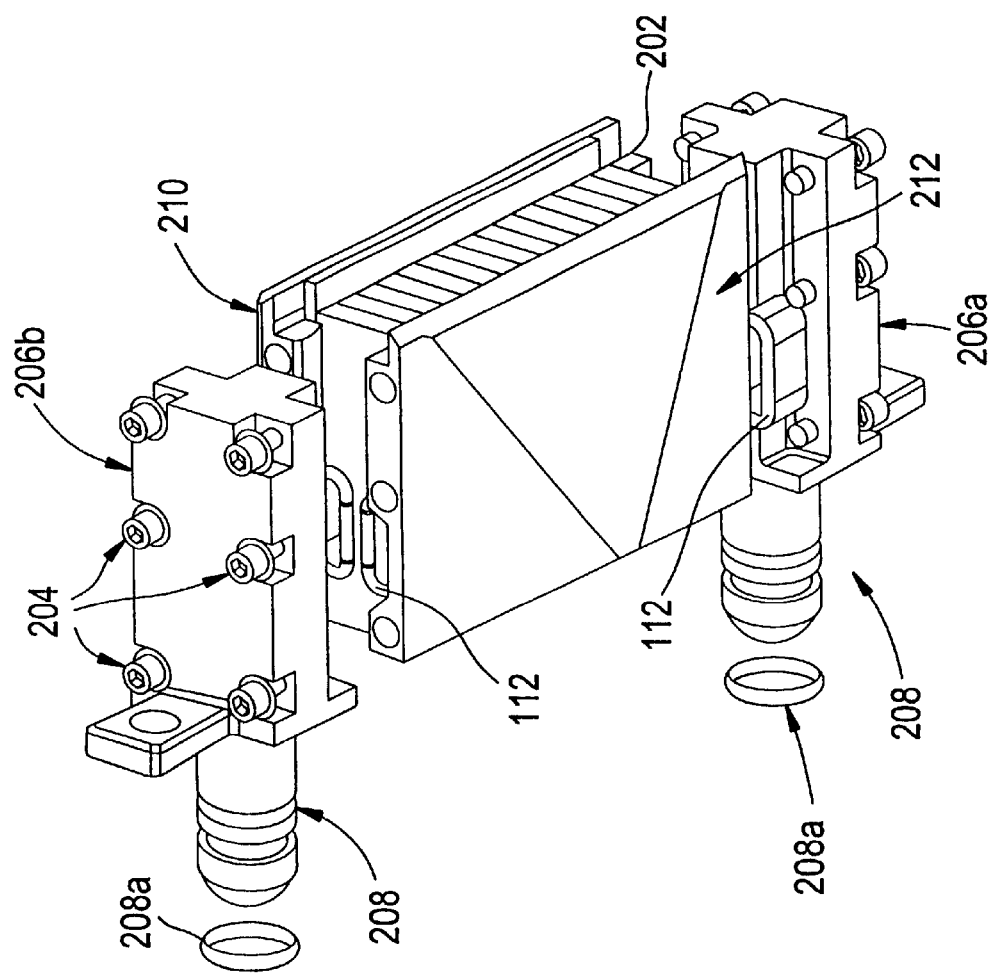
FIGS. 5a–5c collectively illustrate a laser diode array according to a first preferred embodiment of the laser diode array according to the present invention.
Figure 5B:
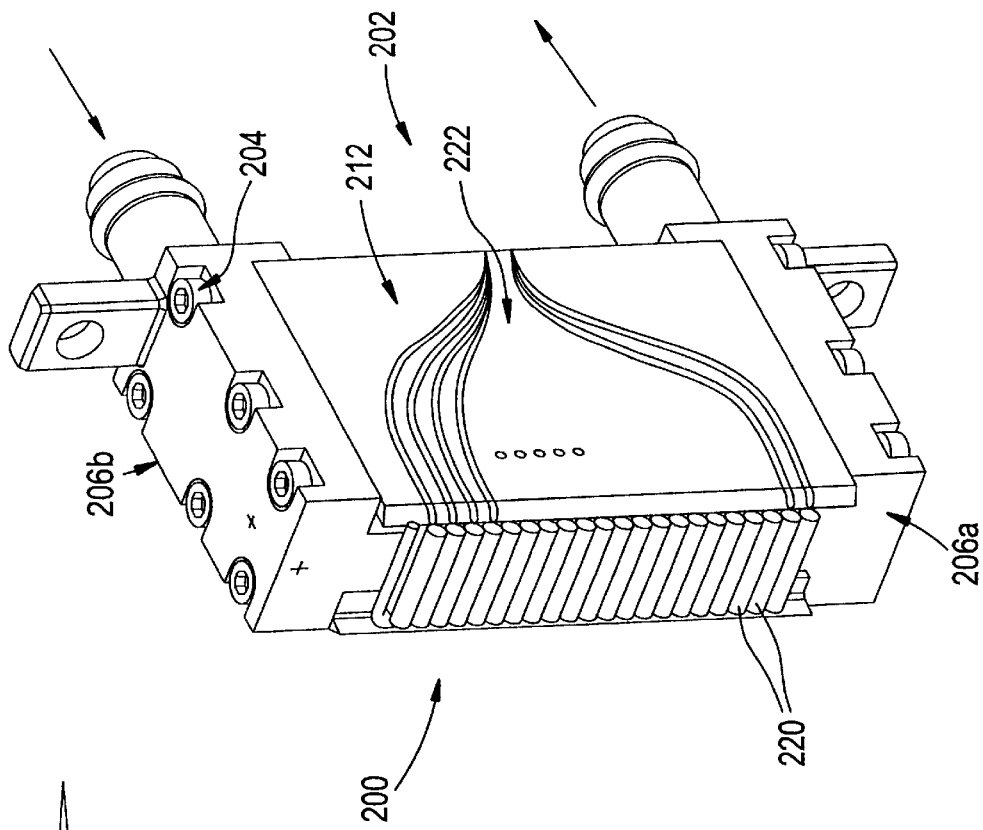
Figure 5C:
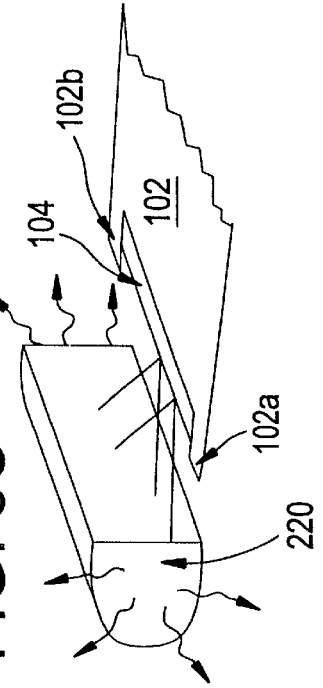

Now referring to FIGS. 5a–5c, it will be appreciated that a plurality of the laser diode units 100 advantageously can be stacked to any arbitrary height, to thereby form the laser diode assembly 202 of the laser diode array 200. Typically, twenty laser diode units 100 are employed in the laser diode assembly 202, although it will be noted that laser diode assembly's 202 containing more or fewer laser diode units 100 are possible.

Still referring to FIGS. 5a and 5b, it will be noted that the laser diode assembly 202 is disposed between manifolds 206a, 206b, which, in an exemplary case, are attached to the laser diode assembly 202 by a plurality of bolts 204. It should be mentioned that the manifolds 206b, 206a serve as the electrical contacts to the laser diode assembly 202, i.e., selected ones of the bolts 204 are electrically connected to the heatsink electrode 102 of the lowermost laser diode unit 100 in the laser diode assembly 202 while other selected ones of the bolts 204 are electrically connected to the electrode 108 of the uppermost laser diode unit 100 in the laser diode assembly 202. It should also be noted that the manifolds 206a, 206b include quick disconnect elements 208 provided with O-ring seals 208a for routing coolant to and removing coolant from the plurality of coolant channels 110 formed by the laser diode assembly 202. Additional structural support for the laser diode array 200 advantageously is provided by a pair of side plates 210, 212, as discussed in greater detail below.

As illustrated in FIGS. 5b and 5c, a series of cylindrical, aspheric, or prism lens 220 are aligned to the front of the laser diode assembly 202. Preferably, each of the lenses 220 is attached to a corresponding heatsink electrode 102 at tabs 102a, 102b. Preferably, the lenses 220 advantageously can be precisely aligned; this alignment being maintained because of the construction of the laser diode assembly 202. Each of these optical elements, i.e., one of the lenses 220, serves to collimate the output of one level of the laser diode assembly 202, either in the transverse direction, the lateral direction, or both directions simultaneously.

Figure 6:
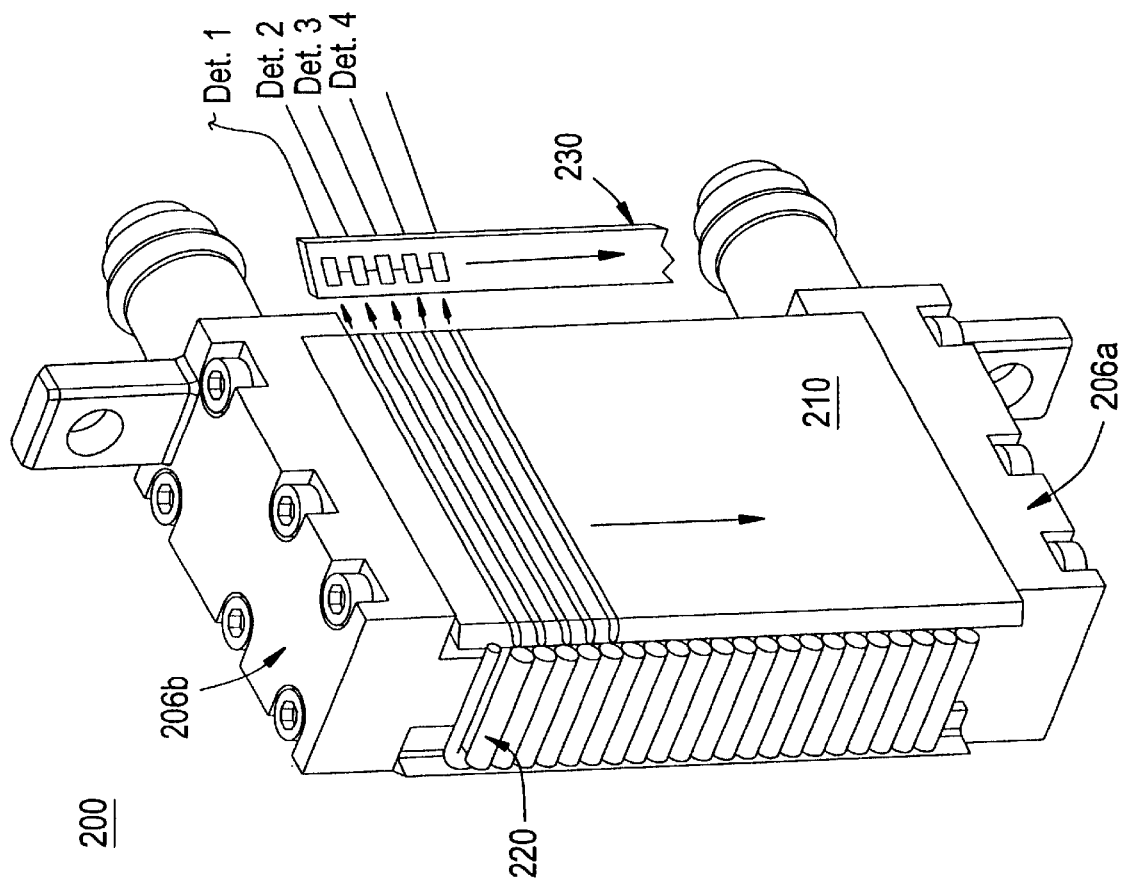
FIG. 6 illustrates an alternative configuration of the laser diode array of FIGS. 5a–5c.

In accordance with a first embodiment of the present invention, each lens 220 advantageously can be employed to sample the output of the laser diode unit 100 without degrading the amount of light applied to downstream optical elements. Stated another way, since the lenses 220 are normally as long as the corresponding laser diode bar 104 that they are being used to collimate, a significant amount of light is scattered along each lens 220. Moreover, since each lens 220 has a higher index of refraction than the surrounding air, the light, which is scattered into high angles, is trapped in the lens 220. This light propagates along the lens 220 and exits at the ends of the lenses 220. Advantageously, the light exiting at the ends of the lenses 220 can be collected by one or both of the side plates 210, 212. In the first preferred embodiment according to the present invention, the light is collected by a 45° angled facet on the side plates. The collected light is then waveguided via fiber optic cable 222 embedded in each side plate 210, 212 toward the back of the laser diode array 200 where it is combined into a single output. It will be appreciated that the combined output from all of the laser diode units 100 advantageously can be applied to a single detector 240 (depicted in FIG. 8). Alternatively, as shown in FIG. 6, each output of the respective laser diode units 100 advantageously can be separately waveguided to a detector array 230.

It should be mentioned at this point that either or both of the side plates 210, 212 advantageously can include a "light pipe" for conveying stray light, i.e., light not contributing to the focused output of the lens 220, to an optical detector, e.g., detector array 230 or detector 240. Hereinafter, while only the side plate 210 will be addressed, it will be understood that either, or both of the side plates are encompassed by this terminology.

Figure 7A:
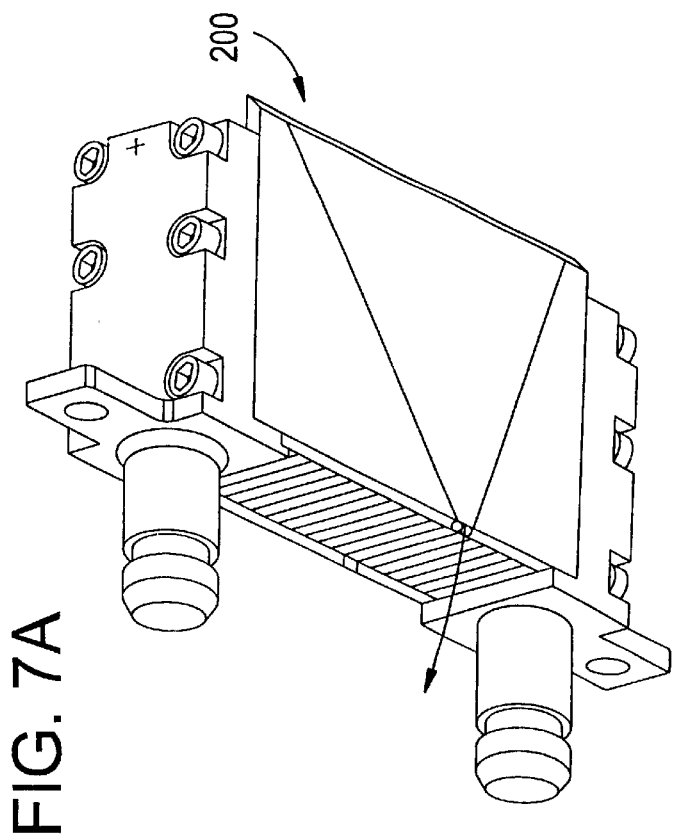
FIGS. 7a–7b collectively illustrate another alternative configuration of the laser diode array of FIGS. 5a–5c.
Figure 7B:
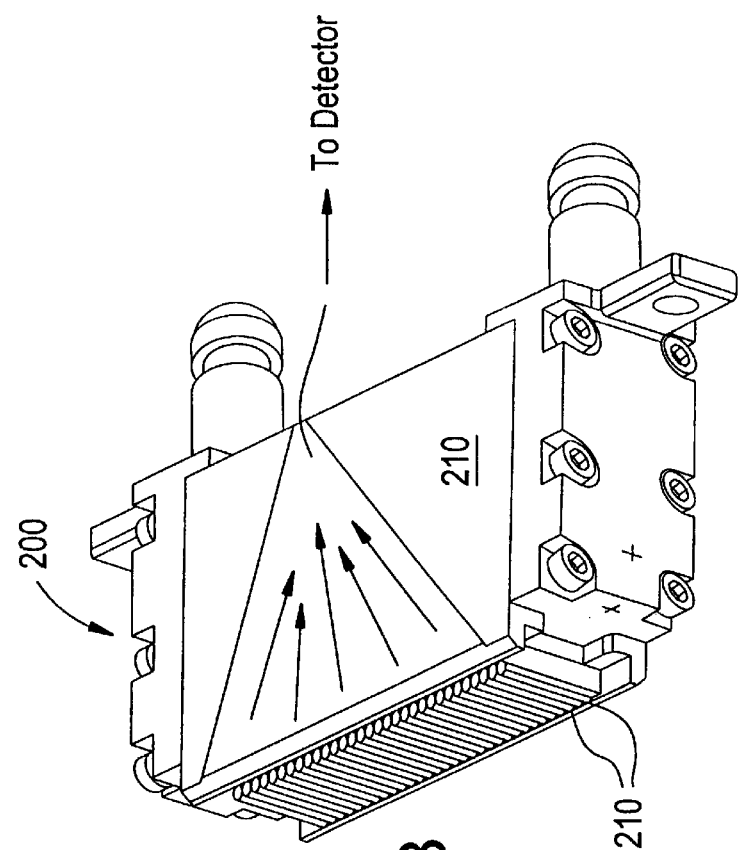

In an alternative to the first preferred embodiment according to the present invention illustrated in FIGS. 7a and 7b, the light is first collected by a 45° angled facet on the side plate 210 (see FIG. 8), and is then waveguided toward the back of the laser diode array 200 by the transparent side plate 210. Since the index of the side plate 210 is 1.5, and the index of air is 1, the side plate 210 advantageously forms an excellent waveguide in the transverse direction. The concentration and mixing of the total power of the laser diode array 200 is accomplished by the taper cut into the side of the side plate 210. This taper acts as a non-imaging concentrator, it directs the sampled light toward detector 240 (See FIG. 8.) mounted at the back of the laser diode assembly 202 in the laser diode array 200. It should be mentioned that the tapered cut can be a cut directly in the side plate 210, extending some fraction of the way through the side plate. Alternatively, the taper cut can be a separate waveguide section molded into an opaque side plate. It will be appreciated that this structure enables the laser diode system to monitor the output power of the laser diode assembly 202 at all times. Moreover, when combined with the system electronics, it is possible to monitor the continuous degradation of the performance of the laser diode array 200.

Figure 8:
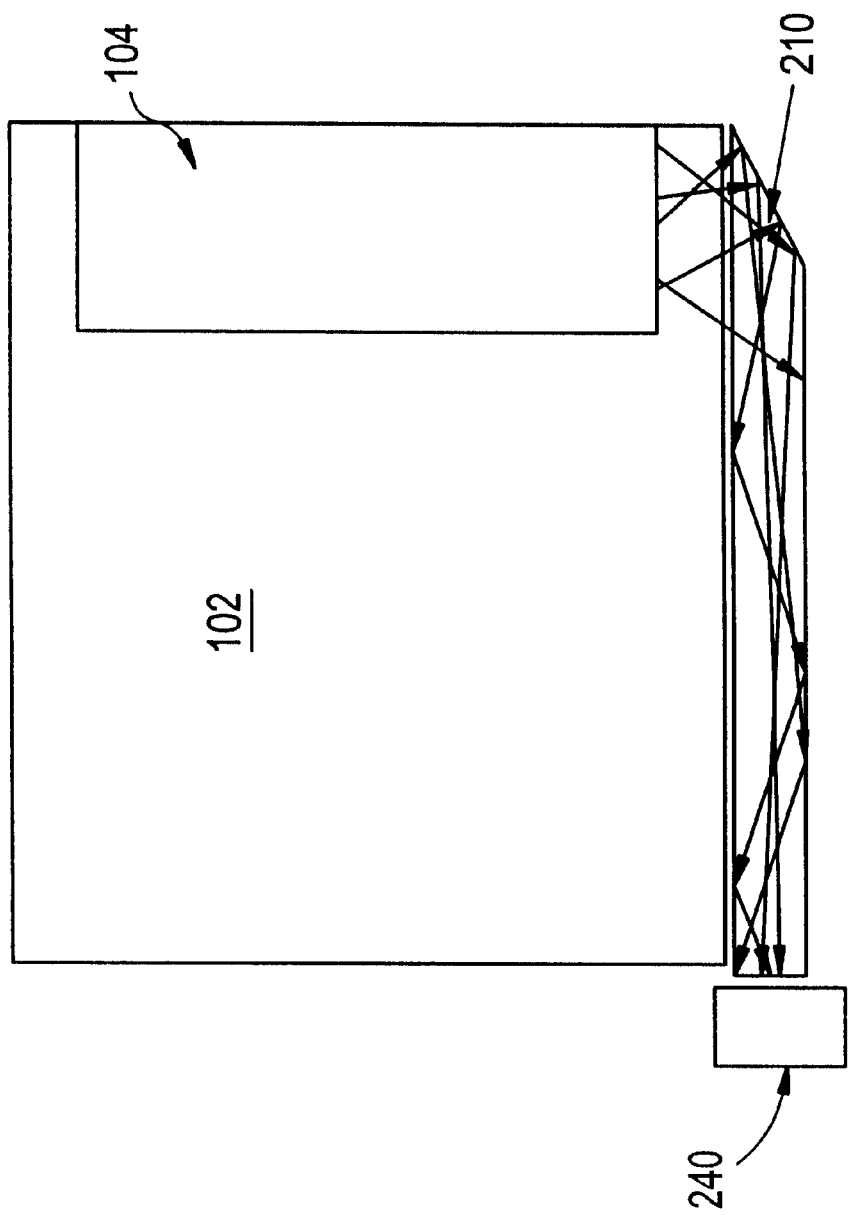
FIG. 8 illustrates a second preferred embodiment of the present invention with respect to the laser diode unit depicted in FIGS. 3 and 4.

A second preferred embodiment according to the present invention will now be described while referring to FIGS. 4 and 8, where the side plate 210 is adapted to receive stray light produced by random spontaneous emissions from the edge of the laser diode bar 104. From FIG. 4 it will be appreciated that at least a portion of the laser diode bar 104 extends above the heatsink electrode 102. Thus, emissions from the laser diode bar 104 advantageously can be collected at the side plate 210. It will also be appreciated that the alternative configurations of the side plate 210 illustrated in FIGS. 5a, 5b, 6, 7a, and 7b are also applicable to the side plate 210. In fact, all configurations of the side plate permitting stray spontaneous emissions from the laser diode bar 104 to be collected are considered to fall within the scope of the present invention.

Figure 9:
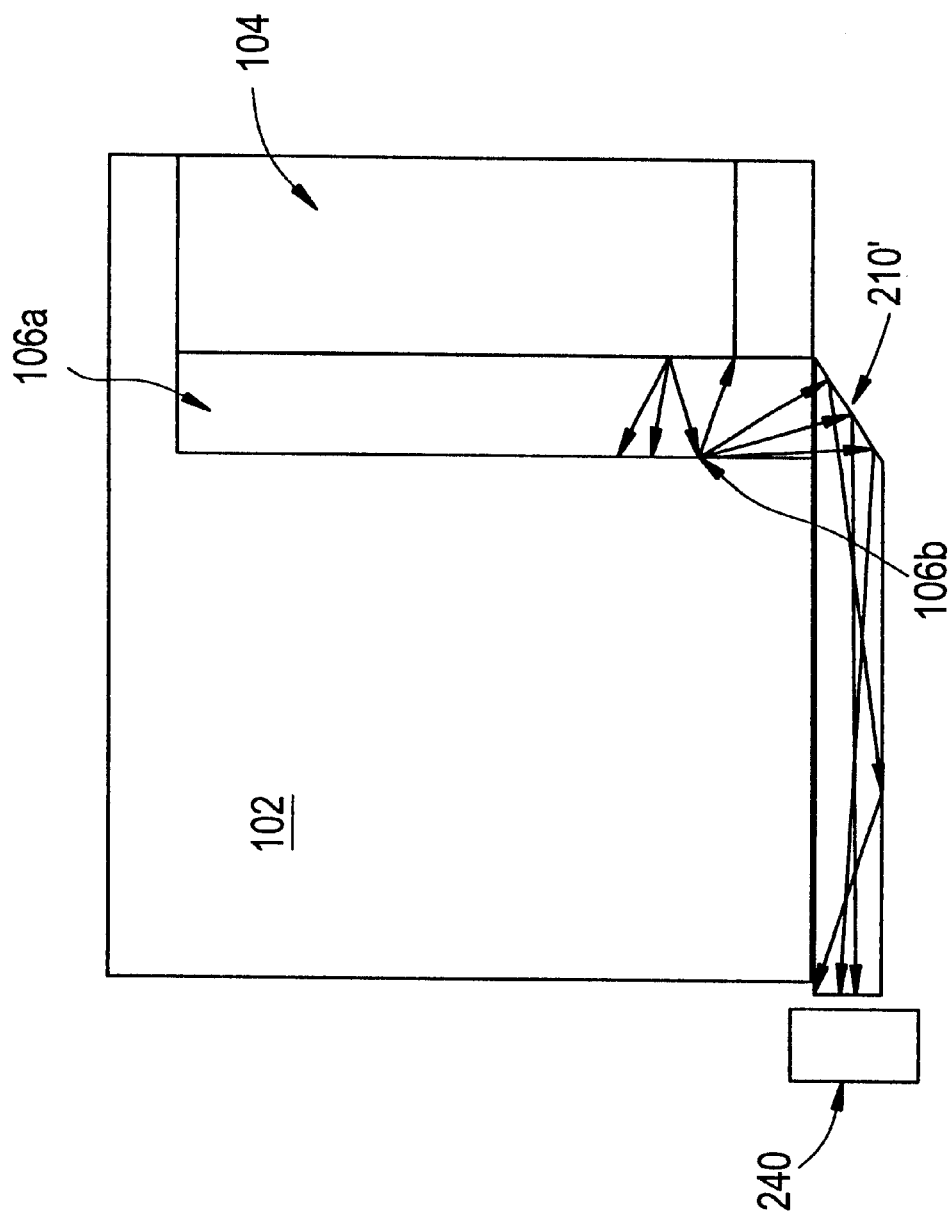
FIG. 9 illustrates a third preferred embodiment of the present invention with respect to the laser diode unit depicted in FIGS. 3 and 4.

For example, in a third alternative embodiment according to the present invention illustrated in FIG. 9, the spontaneous emissions from the rear of laser diode bar 104 advantageously can be collected by a secondary light pipe 106a, which is disposed between the laser diode bar 104 and the isolator 106. The secondary light pipe 106a is preferably constructed from a transparent material such as glass, although other plastic or crystalline materials, to name a few, can also be employed. Advantageously, the surface 106b of the secondary light pipe 106a can be treated or otherwise prepared to promote further reflections whereby the spontaneous emissions are coupled out of the secondary light pipe 106a and into the side plate 210, i.e., the primary light pipe. It will be appreciated that the alternative configurations of the side plate 210 illustrated in FIGS. 5a, 5b, 6, 7a, and 7b are also applicable to the side plate 210 illustrated in FIG. 9.

Figure 10:
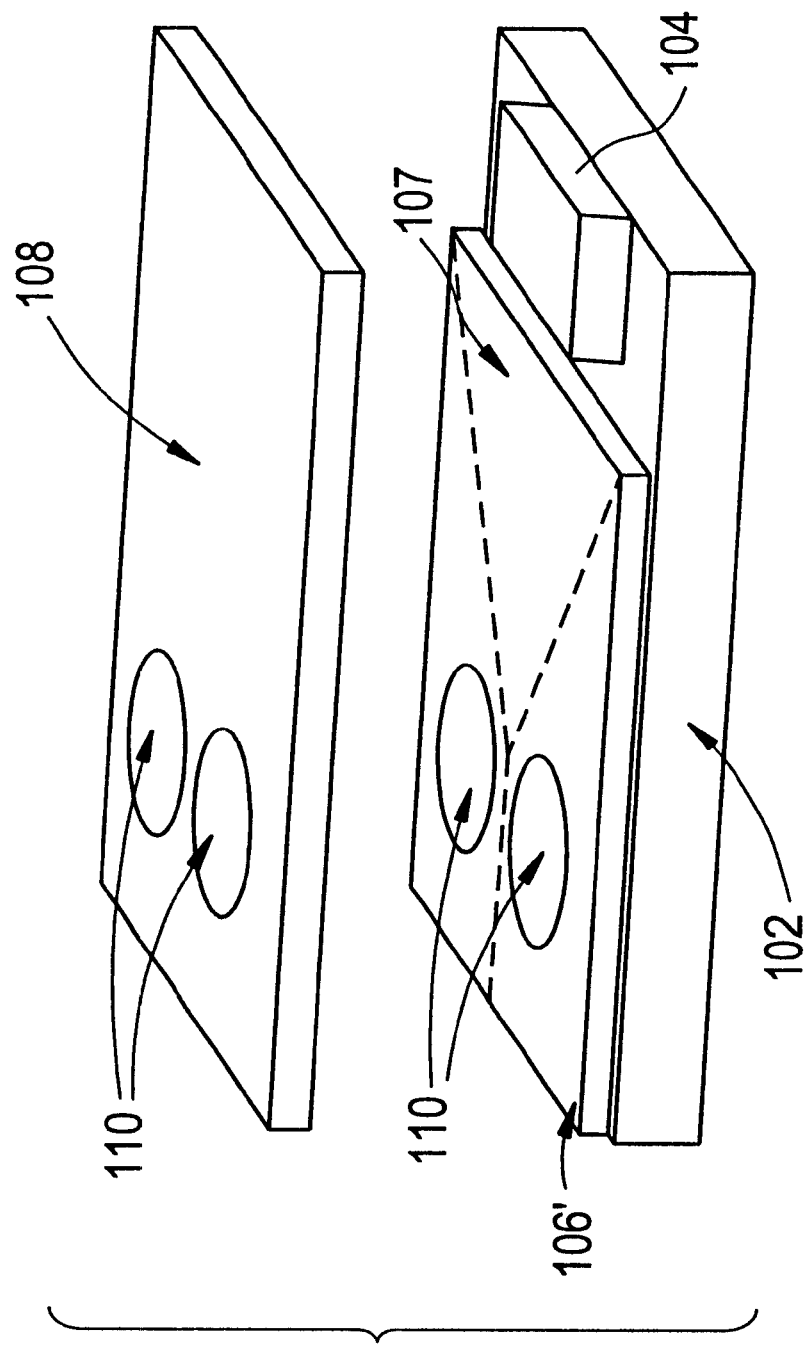
FIG. 10 illustrates a fourth preferred embodiment of the present invention with respect to the laser diode unit depicted in FIGS. 3 and 4.

Referring now to FIG. 10, in a fourth preferred embodiment according to the present invention, the light pipe which conducts spontaneous emissions from the rear surface of laser diode bar 104 advantageously can be a suitably configured isolator 106, which includes a taper 107 cut into the side of the isolator 106. It will be appreciated that the taper 107 transitions to a straight section in order to avoid the coolant channels 110. This taper 107 acts as a non-imaging concentrator; it directs the sampled light toward a detector, e.g., one of the detectors Det.1–Det. 4 included in the detector array 230 of FIG. 6, which advantageously can be positioned along the axis of the laser diode unit 100, i.e., mounted at the back of the laser diode assembly 202 in the laser diode array 200. It should be mentioned that the tapered cut could be a cut directly in the isolator 106, extending some fraction of the way thorough the isolator. Alternatively, the taper cut can be a separate waveguide section molded into an opaque isolator 106. It will be appreciated that this structure enables the laser diode system to monitor the output power of the individual laser diode units 100 in the laser diode assembly 202 at all times. Moreover, when combined with the system electronics, it is possible to monitor the continuous degradation of the performance of discrete elements of the laser diode array 200.

It will be appreciated that the laser diode system discussed above provides a feedback mechanism which is both much simpler and more robust than other feedback mechanisms. In addition, it will be noted that the feedback mechanism permits the optical power output of a laser diode array to be sampled either collectively or section-by-section, depending on the configuration, throughout the effective life of the laser diode array. When the feedback mechanism permits section-by-section sampling of laser diode bar optical power output, the feedback mechanism permits early identification of under performing laser diode bars.

It will also be appreciated that by incorporating the sampling and/or feedback mechanism into a structural member of the laser diode array, the footprint of the laser diode array remains virtually unchanged. Advantageously, the sampling mechanism for the laser diode array according to the present invention does not occupy the limited space, (i) between the diode source and the coupling optics or (ii) the coupling optics and fiber bundle or laser medium. In other words, the light intended for use downstream of the laser diode or laser diode bar is not used as an input to the feedback and/or sampling mechanism.

Although presently preferred embodiments of the present invention have been described in detail hereinabove, it should be clearly understood that many variations and/or modifications of the basic inventive concepts herein taught, which may appear to those skilled in the pertinent art, will still fall within the spirit and scope of the present invention, as defined in the appended claims.

What is claimed is:

1. A laser diode apparatus, comprising:
   a laser diode which emits light in a first direction from a front facet;
   a heatsink electrode electrically coupled to a bottom facet of the laser diode;
   an electrode electrically coupled to a top facet of the laser diode; and
   an isolator disposed between the heatsink electrode and the electrode, the isolator including a light pipe collecting spontaneous emissions from at least one of a rear, a left side, and a right side facet and waveguiding the collected spontaneous emissions in a second direction opposite to the first direction.

2. The laser diode apparatus as recited in claim 1, wherein the laser diode comprises a laser diode bar.

3. The laser diode apparatus as recited in claim 1, wherein the light pipe comprises transparent material.

4. The laser diode apparatus as recited in claim 3, wherein the isolator comprises a non-conducting material.

5. The laser diode apparatus as recited in claim 1, wherein the laser diode, the heatsink electrode, the electrode, and the isolator define a laser diode unit, and wherein the laser diode apparatus comprises a plurality of the laser diode units.

6. A laser diode system permitting indirect measurement of optical power, comprising:
   a laser diode which emits light in first direction from a front facet;
   a heatsink electrode electrically coupled to a bottom facet of the laser diode;
   an electrode electrically coupled to a top facet of the laser diode;
   an isolator disposed between the heatsink electrode and the electrode; and
   a structural element including a light pipe collecting stray light different from but proportional to a usable component of the light and waveguiding the stray light in a second direction opposite to the first direction to thereby generate a stray light beam providing an indication of optical power.

7. The laser diode system as recited in claim 6, wherein the structural element comprises a side plate.

8. The laser diode system as recited in claim 7, further comprising a lens attached proximate to the front facet of the laser diode, wherein the stray light is substantially equal to the difference between the light and the usable component of the light, and wherein the side plate is optically coupled to receive the stray light but not to receive the usable component of the light from the lens.

9. The laser diode system as recited in claim 7, wherein the stray light corresponds to spontaneous emissions from one of a left side and a right side facet of the laser diode.

10. The laser diode system as recited in claim 7, further comprising a secondary light pipe disposed between the laser diode and the isolator, the secondary light pipe receiving stray light including spontaneous emissions from one of a rear facet, a right side facet and a left side facet of the laser diode and waveguiding the stray light to the side plate.

11. The laser diode system as recited in claim 7, wherein the light pipe comprises an optical fiber.

12. The laser diode system as recited in claim 6, wherein the laser diode, the heatsink electrode, the electrode and the isolator define a laser diode unit, wherein the laser diode system comprises a plurality of laser diode units, and wherein the structural element comprises a side plate operatively coupled to the laser diode units.

13. The laser diode system as recited in claim 12, wherein the side plate further comprises a plurality of optical fibers, each of the optical fibers being optically coupled to a respective one of the laser diode units.

14. The laser diode system as recited in claim 13, further comprising a detector array which indirectly measures optical power of the laser diode units, wherein each of the optical fibers generates an output beam responsive to the respective stray light, and wherein each of the optical fibers is coupled to a respective detector in the detector array.

15. The laser diode system as recited in claim 12, wherein the side plate further comprises a transparent material which concentrates stray light from all of the laser diode units into a single stray light beam.

16. The laser diode system as recited in claim 12, wherein the side plate comprises first and second side plates.

17. The laser diode system as recited in claim 6, wherein the laser diode comprises a laser diode bar.

18. A laser diode system permitting indirect measurement of optical power, comprising:
   a laser diode which emits usable light from a front facet and spontaneously emits stray light substantially proportional to the usable light from another facet; and
   a light pipe, disposed proximate to the laser diode, which collects and waveguides only the stray light to thereby generate a stray light beam providing an indication of optical power.

19. The laser diode system as recited in claim 18, wherein the laser diode comprises a laser diode bar.

20. A laser diode system permitting indirect measurement of optical power, comprising:
   first means for emitting usable light in a first direction and for spontaneously emitting stray light substantially proportional to the usable light in a different direction; and
   second means for collecting and waveguiding only the stray light to thereby generate a stray light beam providing an indication of optical power.

* * * * *